United States Patent

Cannella et al.

[11] Patent Number: 4,768,096
[45] Date of Patent: Aug. 30, 1988

[54] CONTACT-TYPE PORTABLE DIGITIZING WAND FOR SCANNING IMAGE-BEARING SURFACES

[75] Inventors: Vincent D. Cannella, Birmingham; Zvi Yaniv, Farmington Hills, both of Mich.

[73] Assignee: Energy Conversion Devices, Inc., Troy, Mich.

[21] Appl. No.: 111,234

[22] Filed: Oct. 22, 1987

Related U.S. Application Data

[63] Continuation-in-part of Ser. No. 924,729, Oct. 30, 1986, Pat. No. 4,746,989, which is a continuation-in-part of Ser. No. 912,477, Sep. 29, 1986, Pat. No. 4,691,244, which is a continuation-in-part of Ser. No. 607,153, May 4, 1984, Pat. No. 4,660,095.

[51] Int. Cl.$^4$ ............................................. H04N 1/024
[52] U.S. Cl. ................................ 358/294; 358/213.11; 358/213.13
[58] Field of Search ............... 358/213.11, 213.12, 358/213.13, 213.19, 213.22, 213.29, 212, 294, 93, 98, 100; 357/24 LR, 30 H, 30 G, 30 L; 250/578

[56] References Cited

U.S. PATENT DOCUMENTS

| | | | |
|---|---|---|---|
| 3,603,731 | 9/1971 | Weimer | 358/213.29 |
| 3,696,250 | 10/1972 | Weimer | 358/213.22 |
| 4,067,046 | 1/1978 | Nakatani et al. | 357/30 G |
| 4,149,197 | 4/1979 | Kos et al. | 250/578 |
| 4,226,898 | 10/1980 | Ovshinsky et al. | 357/2 |
| 4,390,791 | 6/1983 | Hatanaka et al. | 250/578 |
| 4,482,804 | 11/1984 | Oritsuki et al. | 358/213.11 |
| 4,652,937 | 3/1987 | Shimura et al. | 358/294 |
| 4,684,998 | 8/1987 | Tanioka et al. | 358/294 |
| 4,691,243 | 9/1987 | Cannella et al. | 358/213.11 |

OTHER PUBLICATIONS

DAK Industries, Inc., Winter 1988 Catalog, pp. 8-9.

*Primary Examiner*—Jin F. Ng
*Assistant Examiner*—Stephen Brinich
*Attorney, Agent, or Firm*—Marvin S. Siskind; Richard M. Goldman

[57] ABSTRACT

A manually operable, portable, digitizing wand adapted to replicate an image on an image-bearing surface when moved across said surface. The portable wand includes an array of photosensitive elements fabricated from thin film semi-conductor alloy material. Each of the elements are non-light transmissive, non-apertured, continuous and adapted to receive illumination from a corresponding small area portion of an image-bearing surface and generate detectable electrical signals representative of the amount of received illumination. Light is proximity focused onto the array of photosensitive elements from corresponding small area portions of the surface and the portable wand is sized and shaped to provide for manual movement across the image on the image-bearing surface.

20 Claims, 4 Drawing Sheets

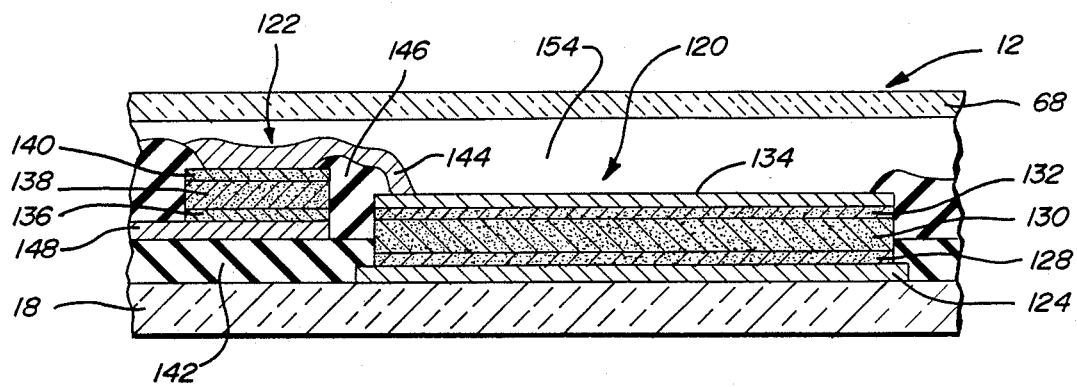
FIG. 3
FIG. 4
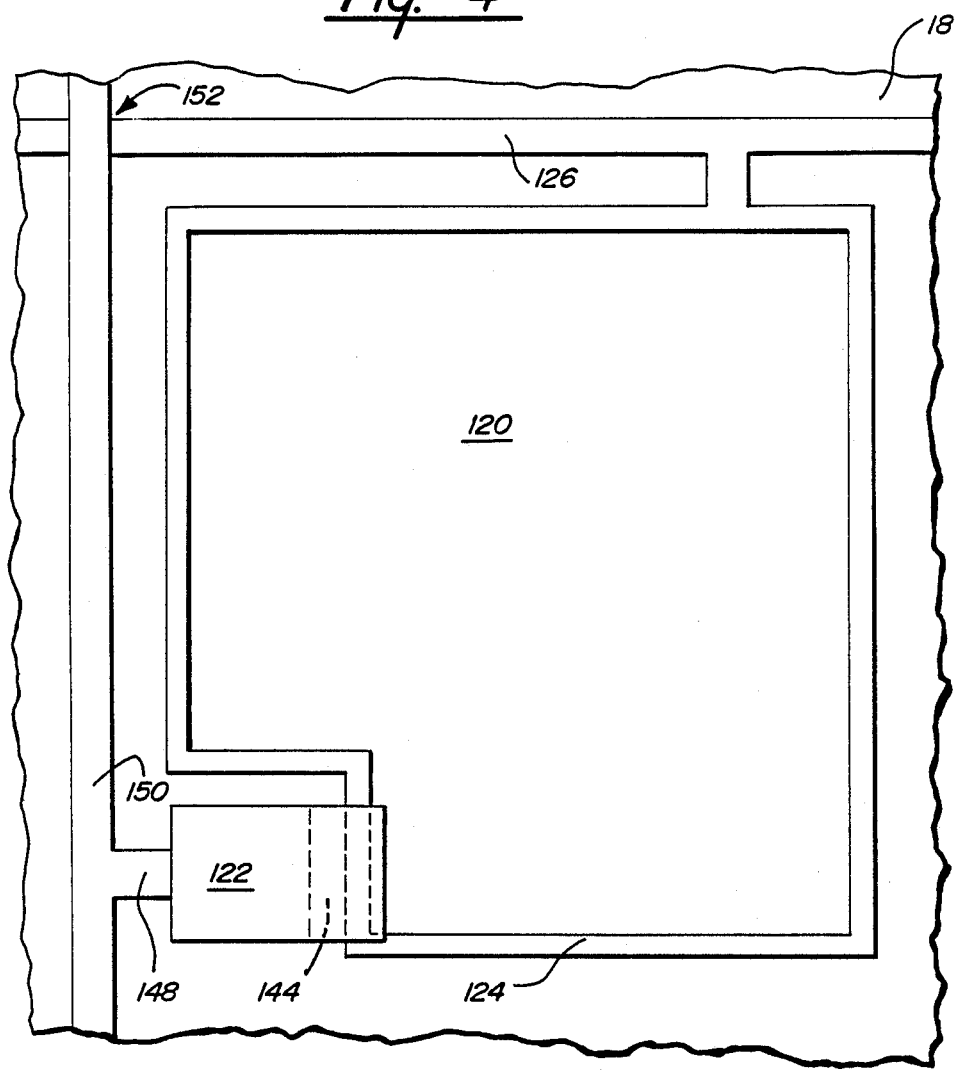

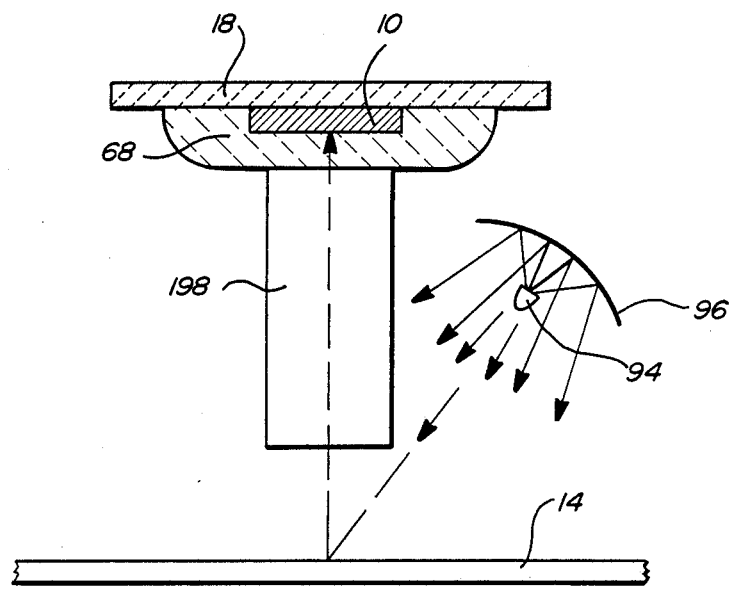

CONTACT-TYPE PORTABLE DIGITIZING WAND FOR SCANNING IMAGE-BEARING SURFACES

RELATED APPLICATIONS

This application is a continuation-in-part application of copending U.S. patent application Ser. No. 924,729 filed Oct. 30, 1986 now U.S. Pat. No. 4,746,989, which is a continuation-in-part of Ser. No. 912,477 filed Sept. 29, 1986 now U.S. Pat. No. 4,691,244 which is a continuation-in-part of Ser. No. 607,153 filed May 4, 1984 now U.S. Pat. No. 4,660,095.

FIELD OF THE INVENTION

The present invention generally relates to a portable wand adapted to photogenerate electrical signals representative of an image on an image-bearing surface. The present invention more particularly relates to a portable, hand-held wand, which wand includes an array of photosensitive elements adapted to photogenerate electrical signals representative of a detectable condition on an image-bearing surface, such as a printed document wherein the image is detectable by sensing the difference in intensity of reflected radiation from the high and low optical density portions thereof. In its most specific form, the instant invention relates to a portable wand adapted to be manually moved across the image bearing surface, and in which the electrical signals are photogenerated as the the array of photosensitive elements housed within the wand is moved past the image bearing surface so as to have light emanating from small area portions of the image-bearing surface "proximity focused" onto associated ones of said elements.

BACKGROUND OF THE INVENTION

Electronic imaging or scanning systems are commonly used to transform an image on an image-bearing surface from one form, such as a paper original, to an electronic form, such as a digital or analog signal. Once an image is converted to an electronic form, many uses of that signal become possible, including, without limitation, the reproduction of the image onto a piece of paper, the projection of the image onto a video display terminal, the transmission of the image to a remote location, and the further processing of that image, such as by a computer, an optical pattern recognition device, or the like.

Electronic imaging systems typically include an array of photosensitive elements, such as photosensors, and a light source operatively disposed to provide illumination of the surface being scanned. In those instances where a linear array of photosensitive elements is employed, it is necessary that either the image on that surface is moved in a direction perpendicular to the longitudinal axis of the linear array, or the linear array of photosensitive elements is moved in a direction perpendicular to the longitudinal axis of that surface. Alternatively, in those instances where a two dimensional array of photosensitive elements is employed, the entirety of the document may be scanned without the need for relative motion therebetween. Regardless of whether linear or two dimensional arrays are employed, the light reflected from the image-bearing surface varies depending upon the image on any small area portion of the surface being scanned, i.e., a darker portion of the surface will cause the photosensitive elements to receive less reflected light, while a brighter portion of the surface will cause the photosensitive elements to receive more reflected light. Since the photosensitive elements effect a detectable change in the electrical conductivity thereof in response to the receipt of differing amounts of incident radiation, the change in conductivity can be detected and relayed in the form of electrical signals.

It will be appreciated that electronic image scanning systems are of great commercial utility insofar as they permit the conversion of human readable data into electronic format, which format is compatible with various electronic processing, transmission and storage operations. Accordingly, electronic image scanners have gained acceptance in such diverse fields as publishing, finance, engineering, telecommunications and the graphic arts. Since electronic image scanners are essentially the "eyes" of data processing systems, their ubiquity should be as great as that of the desk-top computer terminal; however, such is not the case at the present point in time owing in part, to the expense, size and limited scanning capacity of heretofore available scanners.

The assignee of the subject invention has already developed large area electronic image scanners which are specifically adapted to reproducibly scan a pattern of information on a drafting table or a marker board and produce a digital signal corresponding thereto. Such large area scanners are disclosed in commonly assigned U.S. patent application Ser. No. 885,907 filed July 15, 1986 and entitled "Photosensitive Line Imager Utilizing A Movable Scanning Arm", the disclosure of which is incorporated herein by reference. Applicants are also aware of various other commercially available image scanners; however, all of such scanners are relatively large, complex and expensive systems. Therefore, the need remains for a small electronic image scanner, suitable for portable use. Such a scanner should be relatively simple to operate and fairly inexpensive so as to be readily available as an adjunct to personal computing systems and the like. Furthermore, it is highly desirable that any such electrical image scanner be capable of scanning irregularly shaped or oversized documents such as bound material, newspapers, magazines, plywood, textiles and the like.

The aforementioned industrial needs are fulfilled by the portable digitizing wand disclosed herein. More specifically, the instant invention provides for a compact, low cost electrical image scanner capable of providing a digital signal corresponding to information upon a wide variety of substrates including, single printed pages, bound materials, oversized documents and drawings or the surface condition present on woods, metals, plastics and textiles.

The scanner of the present invention comprises a portable digitizing wand, said wand equipped with an array of photosensitive elements housed internally thereof. Manual scanning of the variety of documents, or other information-bearing surfaces, may be readily accomplished by merely passing the wand across the information-bearing surface so as to bring the photosensitive array in close proximity to the image-bearing surface. Relative motion between the document to be scanned and the wand is achieved by moving the wand past the stationary document. In this manner, the image scanner of the instant invention is adapted for the automatic scanning of image-bearing documents in a manner akin to the more conventional scanners referred to hereinabove.

It may thus be seen that the present invention discloses a unique electronic image scanner which is of relatively small size so as to provide for the use thereof in libraries, public transportation vehicles or other work areas in which access to an electrostatic copying machine is restricted. In its most simplistic form, the image scanner of the instant invention includes a portable digitizing wand which may be used in a "proximity focusing" manner so as to manually scan bound or odd-size documents.

These and other features and advantages of the present invention will be apparent from the drawings, the brief description of the drawings and the detailed description of the drawings which follow.

SUMMARY OF THE INVENTION

Disclosed as part of the subject invention is a portable digitizing wand adapted to photogenerate electrical signals representative of small area portions of an image projected onto corresponding small area photosensitive elements housed within said wand. In accordance with one important embodiment of the invention's operation, there is provided a portable contact-type digitizing wand which is adapted to electronically scan a document or other image-bearing surface disposed in close proximity thereto. To that end, the portable wand is sized and shaped so as to provide for hand held, manual use, and more particularly is adapted to be manually moved across an image bearing surface.

The present invention therefore provides a wand adapted to photogenerate electrical signals representative of a detectable condition on an image-bearing surface, which wand includes an array of spacedly disposed, continuous, small area, photosensitive elements formed from deposited, thin film, semiconductor alloy material operatively disposed and designed for receiving said image. Each of these small area elements is capable of effecting a detectable electrical characteristic responsive to the intensity of light incident thereon and emanating from a corresponding small area portion of the image on the image bearing surface. The array includes at least one column of photosensitive elements operatively disposed upon a layer of transparent electrically conductive material, so as to cover at least a portion of at least one dimension of the image-bearing surface across which it is manually moved. A transparent protective cover layer underlies said photosensitive elements, which cover layer forms at least a part of a spacer which is operatively disposed for closely positioning the photosensitive elements in juxtaposed relation relative to said image-bearing surface so as to "proximity focus" light onto said photosensitive elements from corresponding small area portions of said surface. The protective cover layer is formed of an abrasion resistant material selected from the group consisting essentially of a silicon-carbon alloy, a silicon-nitrogen alloy, a silicon-oxygen alloy or a microcrystalline carbon alloy.

The semiconductor alloy material from which the photosensitive elements are fabricated is selected from the group consisting essentially of silicon, germanium or combinations thereof and may further have one or more density of states reducing elements, such as hydrogen or fluorine, added thereto. The photosensitive elements may be operatively utilized as p-i-n photovoltaic diodes or photoresistors.

Preferably, associated with each of the photosensitive elements is an isolation element, such as a diode or field effect transistor for facilitating the selective addressing and detection of the electrical conductivity of each photosensitive element by the application of read potentials to respective pairs of address lines associated with each of said elements.

Also included as part of the wand is a source for projecting light onto the image-bearing surface, said source operatively disposed on the side of the image-bearing surface closest to said cover layer. The light projecting source is adapted to transmit radiation through the interstitial segments of the wand array of photosensitive elements, said interstitial segments defined by the part of the surface area of the substrate not having photosensitive elements or isolation elements deposited thereupon. The electrical signals photogenerated by said photosensitive elements in response to radiation incident upon each photosensitive element can therefore be correlated by the associated, downstream processing means into the image of small area portions of the image bearing surface adjacent each of the photosensitive elements.

Further, a static shielding layer may be interposed, as by vacuum deposition, between the photosensitive elements and the transparent protective layer to ensure that any static discharge initiated by the relative motion between the wand and the image-bearing surface cannot induce an electrical charge in the adjacent array of photosensitive elements.

In its most preferred embodiment, the wand is moved past the juxtaposed image bearing surface so as to provide a relatively small, compact, lightweight contact-type of image scanning wand particularly adapted for downstream interconnection with related apparatus such as display apparatus, memory buffing apparatus or related data processing apparatus.

BRIEF DESCRIPTION OF THE DRAWINGS

FIG. 3 is an enlarged, partial cross-sectional side view illustrating a photosensitive element and an associated isolation element of FIG. 2;

FIG. 4 is a top plan view of the photosensitive element and the associated isolation element illustrated in FIG. 3;

FIG. 6C is a cross-sectional view depicting the use of an optical lens technique in which incident radiation is reflected from the image on an image-bearing surface onto a corresponding photosensitive element of the array illustrated in FIG. 1.

DESCRIPTION OF THE PREFERRED EMBODIMENTS

Figure 1:
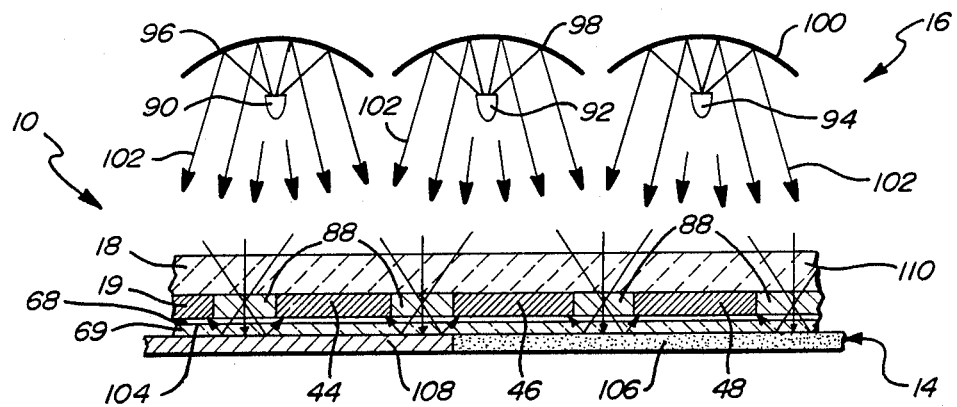
FIG. 1 is partial side view, partly in cross section, of the digitizing wand of the present invention, said wand including an array of photosensitive elements and adapted to scan an image bearing surface disposed thereunder.
Figure 2:
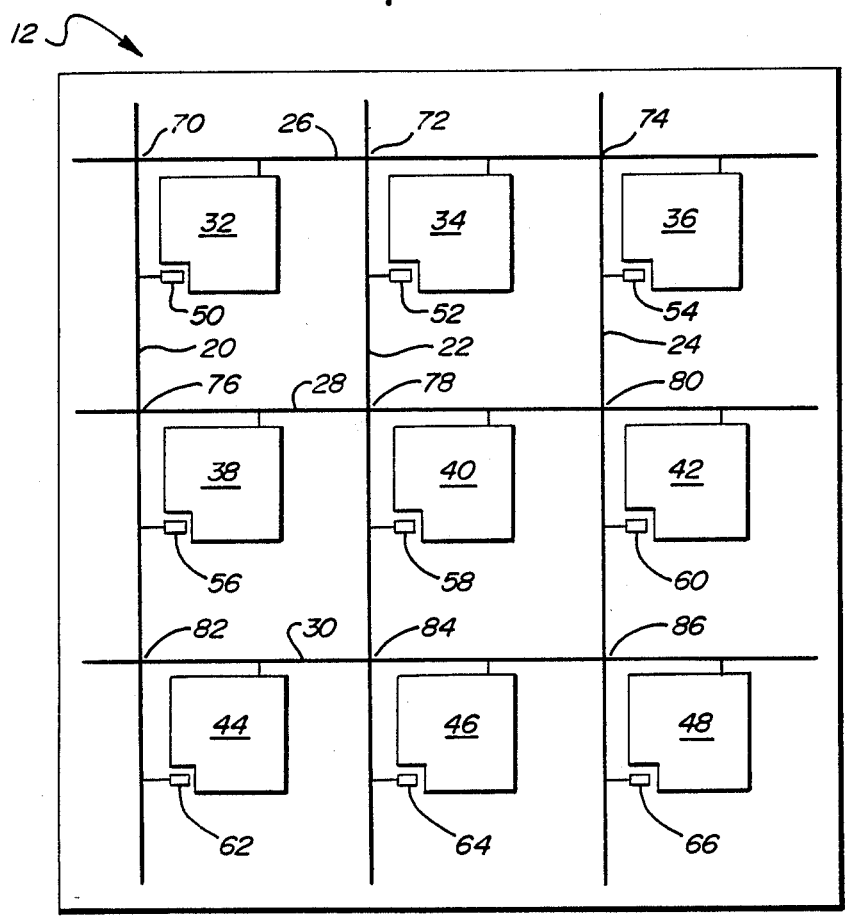
FIG. 2 is a stylistic top plan view of the array of elements at least partially housed within the wand of FIG. 1 with the photosensitive elements and associated isolation elements exposed.

FIGS. 1 and 2 illustrate a contact-type portable digitizing wand system, generally referred to by the reference numeral 10, which wand system 10 is employed so as to embody the concepts disclosed by the present invention. The system 10 illustrated in FIG. 1 generally includes a wand 12 adapted to provide electrical signals representative of a detectable condition of an image on an image-bearing surface 14 disposed thereunder and one or more light sources 16 disposed thereover.

The wand 12 includes a transparent substrate 18, which is formed from glass; a first set of X address lines including address lines 20, 22 and 24; a second set of Y address lines including address lines 26, 28 and 30; and a plurality of photosensitive elements 32, 34, 36, 38, 40, 42, 44, 46 and 48. The wand 12 further includes isolation elements 50, 52, 54, 56, 58, 60, 62, 64 and 66, respectively associated with each photosensitive element; and a transparent, abrasion resistant protective layer 68.

As can be noted from a perusal of FIG. 2, the X address lines 20, 22 and 24 and the Y address lines 26, 28, and 30 cross at an angle, and, as will become more apparent from the description which follows hereinafter, are spaced from one another to form a plurality of cross-over points 70, 72, 74, 76, 78, 80, 82, 84 and 86. Associated with each of the cross-over points is a respective one of the photosensitive elements. The photosensitive elements 32–48 are formed on the transparent substrate 18 and are distributed thereover in spacedly disposed relation to form interstitial spaces 88 therebetween. The photosensitive elements 32–48 are further formed to be of the type which effect a detectable electrical characteristic in response to the receipt of light thereon. As will also be more fully described hereinafter, the photosensitive elements 32–48 can comprise photovoltaic cells or photoresistors which effect a detectable change in electrical conductivity in response to the receipt of incident light thereon. The photosensitive elements are preferably formed from a deposited semiconductor alloy material, such as an amorphous semiconductor alloy material. Preferably, the amorphous semiconductor alloy material includes a deposited thin film layer of amorphous silicon and/or amorphous germanium. Additionally, the amorphous semiconductor layer also includes elements such as hydrogen and/or fluorine, which elements are adapted to reduce the density of defect states in the energy gap of the semiconductor alloy material. Such alloys can be deposited by plasma-assisted chemical vapor deposition, i.e., glow discharge, as disclosed, for example, in U.S. Pat. No. 4,226,898 which issued on Oct. 7, 1980 in the names of Stanford R. Ovshinsky and Arun Madan for Amorphous Semiconductors Equivalent to Crystalline Semiconductors Produced By A Glow Discharge Process.

Each of the isolation devices 50–66 is associated with a respective one of the photosensitive elements 32–48. The isolation devices are also preferably formed from a deposited semiconductor alloy material, and most preferably, an amorphous semiconductor alloy material including silicon and/or germanium. The amorphous silicon and/or germanium alloy may also include hydrogen and/or fluorine and can be deposited by plasma-assisted chemical vapor deposition as disclosed in the aforementioned U.S. Pat. No. 4,226,898. As can be noted in FIG. 2, each of the isolation device 50–66 is preferably coupled in series relation with its associated photosensitive element 32–48 between respective pairs of the X address lines 20, 22 and 24 and the Y address lines 26, 28 and 30 (obviously, other known types of multiplexing schemes may also be employed without departing from the spirit or scope of the subject invention). As a result, the isolation devices 50–66 facilitate the selective addressing and detection of the electrical conductivity of each of the photosensitive elements by the application of read potentials to respective pairs of the X and Y address lines.

Referring now more particularly to FIG. 1, the light source 16 comprises a plurality of individual light sources 90, 92 and 94, though a single, elongated light source, coextensive in length with the length of the array of photosensitive elements, will work equally well, especially in the case of a linear array of multiplexed sensors. Associated with each of the sources 90, 92 and 94 is a reflector 96, 98 and 100. The light sources 90, 92 and 94 and the reflectors 96, 98 and 100 are arranged to provide diffuse light as indicated by the arrows 102, which light is projected onto the wand 12 on the side of the substrate 18 opposite the image bearing surface 14 to be scanned. The image-bearing surface 14 is operatively disposed under the protective layer 68 which includes a substantially planar document-contacting surface 104. The image-bearing surface 14 includes at least one image-bearing portion 106 of high optical density, hereinafter referred to as the dark portion of the image-bearing surface, and at least one portion 108 of low optical density, hereinafter referred to as the light portion of the image-bearing surface. The protective layer 68 is preferably formed to be relatively thin so that the image-bearing surface 14 is closely spaced in juxtaposed relation to the photosensitive elements, such as, photosensitive elements 44, 46 and 48 illustrated in FIG. 1, for "proximity focusing" light from the image-bearing surface 14 onto associated ones of the photosensitive elements. The thickness of the protective layer 68 is chosen to provide a maximum usable signal consistent with a number of other variable parameters. These variable parameters include the angular distribution of the diffuse light intensity, the width of the photosensitive elements and the spacing between adjacent ones of the photosensitive elements. While, in one embodiment, it is preferable that the thickness of the protective layer 68, the width of the photosensitive elements and the spacing between the photosensitive elements are all of a comparable dimension; in other preferred embodiments and depending upon the sensitivity of the photosensitive elements, the surface finish of the material from which image-bearing surface is fabricated, the pressure with which the image-bearing surface is urged against the protective layer and the strength of the light signal, it has been found that a wide range of relative dimensions may be employed. The key element which typifies this type of "proximity focusing" is a substantially one-to-one relationship between the size of the small area portion of the image being sensed by any given small area photosensitive element and the size of the element itself.

In one embodiment, the protective layer 68 may be affixed to the substrate 18 by a transparent adhesive 110. The adhesive 110 is preferably a material having an index of refraction which matches the index of refraction of the substrate 18 to that of the protective layer 68 so as to minimize the reflection from the surface boundaries bordered by the matching material.

In alternative embodiments, the protective layer 68 may be formed from a thin film of a transparent, abrasion-resistant material which is of less than 1 micron thickness, said film being vacuum deposited directly atop the upper electrode of the photosensitive elements. In this embodiment, the protective layer 68 is formed of wide band gap silicon-nitrogen alloys, silicon oxygen alloys, or silicon carbon alloys. These materials are transparent, hard, abrasion-resistant coatings which also provide a hermetic seal to ambient conditions, the fabrication parameters of which in, for instance, glow discharge deposition systems are well known to routineers in the art.

The scanning wand 12 of FIG. 1 additionally includes a static shielding layer, generally referred to by the reference numeral 69. This shielding layer 69 is incorporated into the system because the inventors of the subject application discovered that a static electrical charge of up to 600 volts or more could build up on the surface of the image-bearing surface 14 which movably contacts the array of photosensitive elements. It is possible that such a large static charge could induce a charge of similar magnitude in the photosensitive elements disposed immediately thereabove, which induced charge is capable of destroying the diode characteristic of those elements. By vacuum depositing a thin film conductive layer, preferably formed of oxides of indium, tin, indium-tin, cadmium, zirconium or zinc between the photosensitive elements and the cover layer 69 the instant inventors further discovered that the static charge could be dissipated. Specifically, by connecting this shielding layer to ground potential (or to substantially the same potential as the photosensitive elements), the built-up static electrical charge on the image-bearing document 14 is substantially prevented from inducing a similar charge in the array of photosensitive elements. As would be apparent to a routineer in the art, the thickness of the shielding layer 69 need only be sufficient to fully cover the surface of the photosensitive elements on which it is deposited, i.e., about 500–2500 angstroms. While the above referenced oxides constitute the preferred material from which to fabricate the shielding layer 69, other conductive, transparent coatings such as thin, non-agglomerating metallic films may be employed with equal advantage.

When the image-bearing surface 14 is to be scanned, the planar document-contacting surface 104 of the protective layer 68 of the wand 12 or any other spacing or light collimating member is placed into intimate contact with the image bearing surface so that the document is disposed in closely spaced juxtaposed relation to the array of photosensitive elements housed therewithin. Then, the light source 16 is energized for projecting the diffuse light 102 onto the back side of the wand 12 and then onto the surface of the image-bearing surface 14 adjacent the planar document-scanning surface 104. In the dark portions 106 of the image on the document 14, the light will be substantially absorbed so that very little of the light impinging upon the dark portions 106 will be reflected back onto the associated photosensitive elements of the manually moving wand 12 proximately disposed adjacent thereto; for example, photosensitive elements 48 and 46. However, the light striking the light portions 108 of the image-bearing surface on the document 14 will not be substantially absorbed and a substantially greater portion of the light impinging upon the light portions 108 will be reflected back onto the associated photosensitive elements proximately disposed adjacent thereto; such as photosensitive element 44. The photosensitive elements adjacent the light portions 108 of the document will thereby effect a detectable change in their electrical conductivity. When the photosensitive elements are formed from photovoltaic cells, they will not only effect a change in electrical conductivity, but they will also generate current. When the photosensitive elements are photoresistors, they will effect an increased electrical conductivity which can be detected by the application of read potentials to the respective pairs of the X address lines 20, 22 and 24, and the Y address lines 26, 28 and 30.

Electrical signals representing a faithful reproduction of the image on the image-bearing surface 14 can be obtained because the photosensitive elements 32–48 can be made very small. For example, the photosensitive elements can be fabricated to have dimensions of approximately 60 microns on a side or less. The isolating devices 50–66 can be formed to have a dimension of about 10–40 microns on a side and preferably 20 microns on a side. Also, the photosensitive elements 32–48 are preferably spaced apart so that they cover only a portion of the substrate 12 to permit the light to be projected onto the image-bearing surface 14, whereby said document is scanned through the interstices which exist therebetween. For example, the photosensitive elements can be spaced so that they cover only a fraction (for example 25–50%) of the overall surface area of the substrate 18. Also, the photosensitive elements can be arranged in substantially coplanar relation so that each will be equally spaced in juxtaposed relation to the document to be scanned. Although FIG. 2 illustrates a 3×3 matrix of photosensitive elements, it can be appreciated that a much larger array of elements would be required in actual practice for scanning the entire surface area of an image-bearing surface.

The electrical characteristics, and, in accordance with this preferred embodiment, the electrical conductivity of the photosensitive elements can be detected by applying read potentials to respective pairs of the X and Y address lines in series and one at a time. However, and most preferably, the photosensitive elements can be divided into groups of elements and the read potentials can be applied to each group of elements in parallel to facilitate a more rapid scanning of the image bearing surface 14. Of course, within each group of photosensitive elements, the elements can be scanned in series.

Referring now to FIGS. 3 and 4, there is illustrated in greater detail the operative configuration of a photosensitive element 120 and an isolation device 122 structured in accordance with the principles of the present invention. Here, the apparatus 10 includes a transparent or glass substrate 18. Formed on the substrate 18 is a metal pad 124 which is electrically connected to a Y address line 126. The metal pad 124 can be formed from, for example, aluminum, chromium, or molybdenum.

Formed on the metal pad 124 are the photosensitive elements 120 which preferably take the form of a photovoltaic cell. The photovoltaic cell or photosensitive element 120 can include an amorphous silicon or germanium alloy body fabricated by successively depositing a first doped region 128, an intrinsic region 130 and a second doped region 132. The regions 128 and 132 are preferably opposite in conductivity so that the region 128 is p-type and the region 132 is n-type. Overlying the n-type region 132 is a layer 134 of a transparent conductive oxide material such as indium tin oxide. Photovoltaic cells of this type are fully disclosed, for example, in the aforementioned U.S. Pat. No. 4,226,898 and therefore need not be described in detail herein.

The metal pad 124 not only forms an ohmic contact with the photosensitive element 120, but in addition, serves to block light from reaching the back side of the light sensitive element. This function of the metal pad 124 is particularly important when the wand system is to be used in accordance with the embodiments illustrated herein. Of course, in those instances in which the image-bearing surface can be back lit, the light blocking function is not necessary, and the metal pad 124 may thus be transparent.

The isolation device 122, fabricated in accordance with this embodiment, comprises a diode, also formed from an amorphous silicon or germanium alloy fabricated through the successive deposition of a p-type region 136, an intrinsic region 138 and an n-type region 140. The diode 122 is also formed on a metal pad 148 which is formed on a layer of a deposited insulating material 142 which can be fabricated from, for example, silicon oxide or silicon nitride. Since the diode 122 and the cell 120 include the same layer composition and structure, said isolation diode 122 can be formed during the same deposition operation as the photovoltaic cell 120.

The isolation diode 122 is coupled to the photovoltaic cell 120 by an interconnect lead 144. Separating the diode 122 from the photovoltaic cell 120 is a deposited insulator 146 which can also be formed from silicon oxide or silicon nitride.

The metal pad 148 is coupled to an X address line 150. As can be noted from FIG. 4, the X address line 150 and the Y address line 126 are spaced apart by the insulating layer 142. Because the address lines cross at an angle and are separated from one another, an insulated crossover point 152 is thereby formed.

The structure of FIG. 3 is completed by the superposed positioning of a transparent cover layer 68 (which can be formed from glass, plastic or the hard thin films described hereinabove) over the diode and the light sensitive element. When fabricated of thin films, said layer is vacuum deposited thereupon and when fabricated of glass or plastic, said layer is adhered thereto by a transparent adhesive which can fill the space 154. The transparent adhesive preferably has an index of refraction (which may be for example 1.45-1.57) which matches the index of refraction of the glass substrate 18 to that of the cover layer 68 so as to provide for the maximum transmission of light from the glass substrate through the layer.

Figure 5:
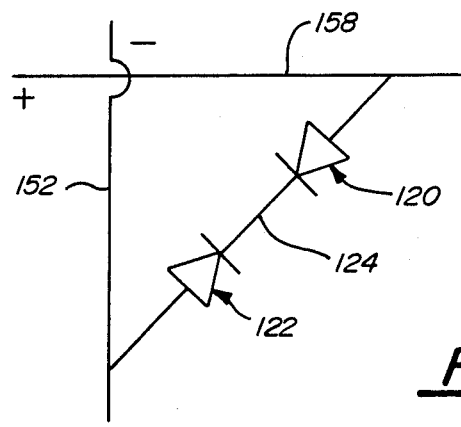
FIG. 5 is an equivalent circuit diagram of the photosensitive element and associated isolation element of FIG. 3, as those elements are operatively connected to the address lines of an x-y matrix.

Referring now to FIG. 5, there is illustrated therein the equivalent circuit diagram of the photosensitive element 120 and the isolation element 122. The cathode of the isolation diode 122 and the cathode of the photosensitive element 120 are electrically coupled together in cathode to cathode relationship. The anode of the photosensitive element 120 is electrically coupled to the Y address line 158 and the anode of the isolation diode 122 is electrically coupled to the X address line 152. In order to read the condition of the photosensitive element 120, an electrical potential is applied to the X address line 152 and a second electrical potential is applied to the Y address line 158 to forward bias the isolation diode 122. If incident radiation is reflected off of a light (low density) small area portion of the image on the image bearing surface 14 and onto the corresponding small area photosensitive element 120, a current will be photogenerated by said photosensitive element and will be detected through the forward biased isolation diode 122. However, if the small area photosensitive element is disposed to receive incident radiation reflected from an associated dark (high density) small area portion of the image bearing surface 14, substantially no light will be reflected from and be incident upon the photosensitive element and hence substantially no current will be photogenerated by said photosensitive element. The difference between the two levels of photogenerated current can therefore be contrasted so as to provide an electrical signal representative of the small area image portions corresponding to each of the photosensitive elements.

Figure 6A:
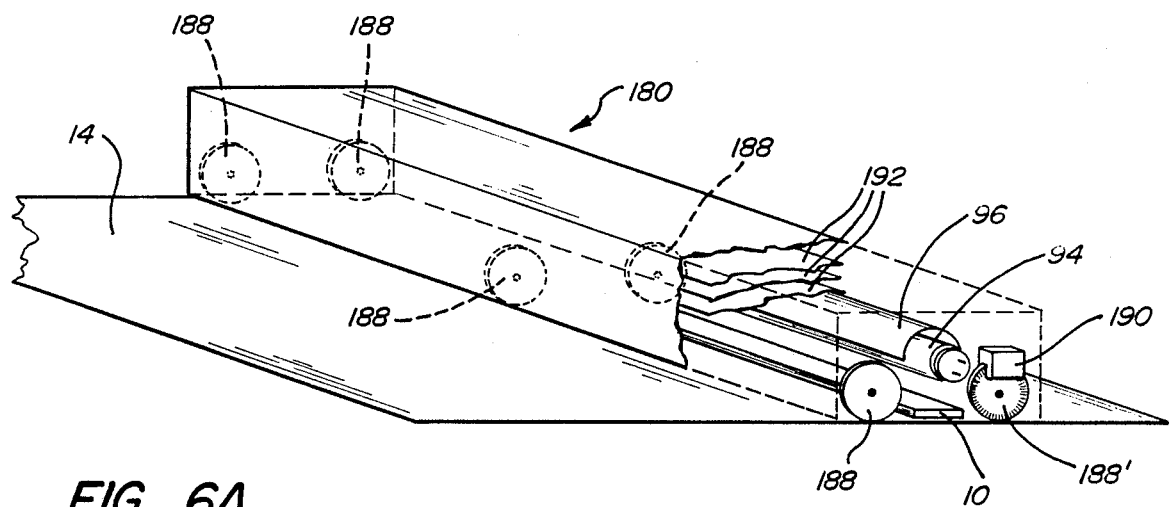
FIG. 6A is a perspective view, partially in phantom outline and partially cut-away, of the portable digitizing wand, and illustrating the array of photosensitive elements, the light source and associated tracking wheels operatively disposed therewithin.
Figure 6B:
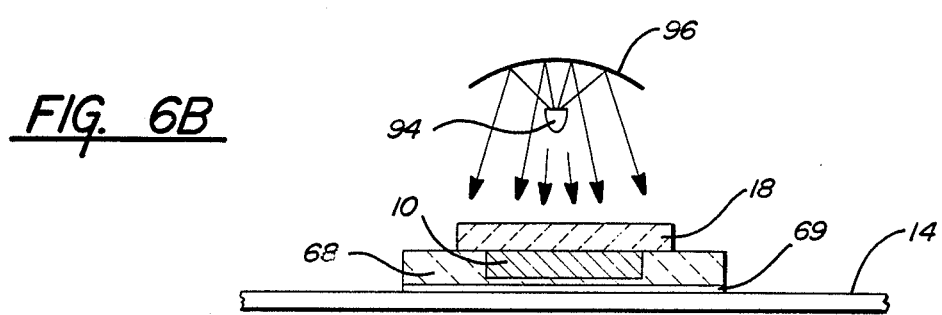
FIG. 6B is a cross-sectional view depicting the use of a contact imaging technique in which incident radiation is reflected from an image on the image-bearing surface onto a corresponding photosensitive element of the array illustrated in FIG. 2.

Referring now to FIGS. 6A-6C, those Figures illustrate the principal components of the portable digitizing wand 12 of the instant invention. More particularly, FIG. 6A illustrates, in cut-away perspective view, one embodiment of the digitizing wand 180, structured in accordance with the principles of the instant invention and as that wand is adapted for use so as to provide a detectable electrical signal corresponding to a surface condition existing upon an image-bearing surface 14.

It will be noted that the digitizing wand 180 is preferable a generally elongated, hand holdable, portable unit preferably shaped and sized so as to enable it to scan the entire width of a document or similar image-bearing surface 14 in a single pass. As will be apparent from the cut-away view of FIG. 1, the wand 180 includes an elongated photoresponsive array of photosensitive elements 10. The elements, which have been described in greater detail hereinabove, are each adapted to receive light from a corresponding small area portion of the surface of the image-bearing surface 14 and generate a detectable electrical signal representative of the amount of reflected radiation received therefrom. It should be apparent that by moving the digitizing wand 180 across the image-bearing surface 14, the photosensitive elements 12 of the photoresponsive array 10 thereof are adapted to scan the entirety of that surface.

Also, housed within and included as part of the digitizing wand 180 is a light source 94, as described hereinabove, said light source preferably being elongated (so as to be coextensive in length with the length of the array) and operatively disposed relative to the photosensitive elements and the image-bearing surface 14 so as to provide illumination to the surface being scanned. As illustrated herein, the light source 94 is an elongated fluorescent tube having a reflector 96 disposed about a portion of the circumference thereof to reflect diffuse rays of light therefrom onto the image-bearing surface 14.

The digitizing wand 180 may further include a plurality of spaced rollers 188 adapted to support the wand 180 while it is being moved across the surface being scanned. These rollers 188 may be wheel-like members as shown, or may alternatively be cylindrical rollers, ball bearings, low friction gliders and the like. It will be noted that one of the wheels 188' may preferably be equipped with a position encoder 190. This encoder 190 may be utilized to provide indexing signals indicative of the passage of the wand 180 across the surface being scanned. Such indexing signals can be utilized for controlling the synchronization of printers, displays, storage devices or other downstream processing equipment with the signal generated by the array of photosensitive elements as said wand scans the image bearing surface.

The indexing signals may be utilized to provide a human-detectible signal such as an audible or visual signal indicative of the progress of the wand 180 moving across the document or other image bearing surface. In some instances, the indexes may sound an alarm if the velocity of the wand 180 is too great for accurate scanning. The wand 180 is also provided with one or more printed circuit boards 192 which are adapted to contain onboard electronic circuitry for implementing necessary operations such as wand position encoding, signal processing, storage of generated signals and so forth. Such circuitry will be described in greater detail hereinbelow.

Referring now to FIG. 6B, there is shown one mode of operation of the photosensitive array system 10 of the instant invention as that system is specifically adapted to scan a pattern of information disposed upon an image-bearing surface 14 such as a document or other similar sheet of material. As illustrated in FIG. 6B, the array 10 is generally similar in structure to that discussed previously with reference to FIG. 1, and preferably, includes a substrate 18 having a plurality of discrete, linearly aligned photosensitive elements 12, (one of which is shown in stylized cross-section of FIG. 3). The photosensitive array 10, as depicted in FIG. 6B, further includes a protective, hard, transparent coating 68 and the transparent static shielding layer 69, as discussed above.

As illustrated in FIG. 6B, and discussed hereinabove, the photosensitive array 12 in the wand 180 is adapted to operate in a proximity focusing mode, that is to say, said array of photosensitive elements 12 are maintained in relatively close proximity to the image-bearing surface 14 being scanned. This close proximity relationship is maintained by a transparent spacing member, in this instance the spacing member being the aforementioned combination of the hard coating 68 and the static shielding layer 69. In a proximity focused mode of operation, a light source 94 is operatively disposed within the portable wand 180 so as to direct radiation of a preselected wavelength upon the surface of the image-bearing surface 14 in such a manner that radiation reflected from small area portions of that surface will strike corresponding small area photosensitive elements maintained in close proximity thereto. Because of the close spatial relationship between the discrete photosensitive elements and the corresponding small area portions of the image on the image-bearing surface 14, each small area element is illuminated only by light emanating from corresponding small area portions of the image-bearing surface 14. In this manner, the image is essentially "focused" onto the individual photosensitive elements without the need for amplifying or reducing lenses or similar optical elements.

It should be apparent that the proximity focusing system shown with reference to FIG. 6B may be modified and still retain its essential function. For example, the transparent protective coating 68 may be replaced by another transparent material such as glass or a synthetic polymeric material either with or without an optional hard coating upon the surface which engages the image-bearing surface 14 being scanned. In some instances, the transparent protective coating 68 may be completely eliminated and the proximity relationship of the photosensitive elements to the small area portions of the image-bearing surface 14 may be maintained by mechanical control of the position of both the image-bearing surface 14 and the photosensitive array 12.

It is to be understood that other optical arrangements may also be utilized to focus radiation reflected from a portion of the image of said image-bearing surface 14 onto corresponding portions of the photosensitive array without departing from the spirit or scope of the instant invention. Referring now to FIG. 6C, there is shown one such alternative optical arrangement which employs a generally cylindrically-shaped, fiber-optic-like lens for directing incident radiation from a small area portion of the image-bearing surface 14 to the appropriate small area photosensitive element of the large area array. As shown in FIG. 6C, light emanating from the light source 94 is reflected from a small area portion of the image-bearing surface 14 being scanned, in all directions including the direction substantially perpendicular to the plane of the image-bearing surface 14. Arranged substantially perpendicular to the plane of the surface 14 is an elongated, linear, non-inverting imaging lens 198, as for example, a one-to-one magnification ratio lens produced by Nippon Sheet Glass Company, Limited of Tokyo, Japan (Selfoc lens array, Cat. No. SLA-09). It is to be noted that the precise dimensions of the surface area viewed for imaging by each of the photosensitive elements of the array will depend upon the specific lens selected. As should be apparent to those ordinarily skilled in the art, other modifications of the optical system may be made in keeping with the spirit and scope of the instant invention. For example, the cylindrical lens 198 may be replaced with a more conventional type of lens. Likewise, a fiber-optic element may be utilized to convey incident radiation to a given photosensitive element from a corresponding small area portion of the image-bearing surface 14 without loss.

It should be understood that the present invention is not limited to the precise structure illustrated in the described embodiment. It is intended rather that the foregoing description be regarded as illustrating said invention rather than limiting it. It is therefore the following claims, including all equivalents, which define the scope of the instant invention.

We claim:

1. Portable wand means adapted to provide electrical signals representative of an image on an image-bearing surface, said wand means including an array of photosensitive elements fabricated from thin film semiconductor alloy material; each of said elements being non-light transmissive, non-apertured, continuous and adapted to receive light from a corresponding small area portion of an image-bearing surface and generate a detectable electrical signal representative of the amount of received light; the improvement comprising, in combination:

said array including at least one column of photosensitive elements operatively disposed so as to cover at least a portion of at least one dimension of an image-bearing surface;

spacing means for closely positioning said photosensitive elements in juxtaposed relation relative to an image-bearing surface so as to proximity focus light onto said photosensitive elements from corresponding small area portions of said surface; and said portable wand means sized and shaped so as to provide for manual movement across the image on said image-bearing surface.

2. Apparatus as in claim 1, wherein said spacing means includes a protective cover layer underlying said array of photosensitive elements; said cover layer formed of a transparent abrasion-resistant material selected from the group consisting essentially of a silicon-carbon alloy, a silicon-nitride alloy, a silicon-oxygen alloy, microcrystalline carbon, and combinations thereof.

3. Apparatus as in claim 2, further including shielding means operatively disposed between the lower electrode of said array of photosensitive elements and said protective cover layer, said shielding means adapted to prevent the build-up of a large static charge; and said shielding means fabricated from a material selected from the group consisting essentially of an oxide of indium, tin, zinc, zirconium, cadmium, gold, silver, aluminum, copper, and combinations thereof.

4. Apparatus as in claim 3, wherein said shielding means is electrically connected to ground potential.

5. Apparatus as in claim 1, wherein the photosensitive elements are fabricated from a thin film semiconductor alloy material selected from the group consisting essentially of a silicon alloy, a germanium alloy, and combinations thereof.

6. Apparatus as in claim 1, wherein said photosensitive elements are fabricated as P-I-N type photovoltaic cells.

7. Apparatus as in claim 1, wherein said photosensitive elements are fabricated as P-I-N type photoresistors.

8. Apparatus as in claim 1, further including isolation means associated with each of said photosensitive elements for facilitating the selective addressing of discrete elements.

9. Apparatus as in claim 8, wherein each isolation means is a diode.

10. Apparatus as in claim 8, wherein each isolation means is a thin film transistor.

11. Apparatus as in claim 1, wherein said portable wand means includes means for projecting light onto said image-bearing surface.

12. Apparatus as in claim 11, wherein said light projection means is of a length substantially coextensive with the length of said array of photosensitive elements.

13. Apparatus as in claim 8, wherein each of the photosensitive elements further includes first and second electrodes.

14. Apparatus as in claim 13, wherein each of the first electrodes of said photosensitive elements are formed upon said substrate as distinct, substantially transparent, thin film, conductive pads; and each photosensitive element and the associated isolation means thereof are formed upon and electrically interconnected by said conductive pad.

15. Apparatus as in claim 14, wherein said substrate is transparent and the conductive pads of said photosensitive elements are spacedly disposed so that light passes through said substrate and between and around said conductive pads to illuminate said image-bearing surface.

16. Apparatus as in claim 1, wherein said array is a 1-dimensional matrix of photosensitive elements adapted for manual movement past said image-bearing surface for the line-by-line scanning thereof.

17. Apparatus as in claim 16, wherein said portable wand means includes roller means for frictionally engaging a surface of said image-bearing surface.

18. Apparatus as in claim 17, wherein audible or video signalling means are coupled to said roller means for providing a signal indicative of the speed of movement of said roller means along said surface.

19. Apparatus as in claim 1, further including downstream processing means to which the electrical signals generated by said photosensitive elements of said portable wand means are transmitted.

20. Apparatus as in claim 19, wherein the processing means are selected from the group consisting essentially of a memory buffer, a display, a computer terminal, a monitor, a copier system, a CAD-CAM system, and combinations thereof.

* * * * *